(12) United States Patent
Kunstmann et al.

(10) Patent No.: US 8,932,476 B2
(45) Date of Patent: Jan. 13, 2015

(54) POROUS METAL ETCHING

(71) Applicant: Infineon Technologies AG, Neubiberg (DE)

(72) Inventors: Thomas Kunstmann, Laaber (DE); Stefan Willkofer, Munich (DE); Anja Gissibl, Regensburg (DE); Johann Strasser, Schierling (DE); Matthias Mueller, Regensburg (DE); Eva-Maria Hess, Gremsdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/762,117

(22) Filed: Feb. 7, 2013

(65) Prior Publication Data
US 2014/0217062 A1 Aug. 7, 2014

(51) Int. Cl.
*B44C 1/22* (2006.01)
*C23F 1/02* (2006.01)
*C23F 1/08* (2006.01)

(52) U.S. Cl.
CPC .... *C23F 1/02* (2013.01); *C23F 1/08* (2013.01)
USPC ............... 216/106; 216/41; 216/96; 216/100; 216/105; 216/108; 257/E21.219; 438/694; 438/745

(58) Field of Classification Search
None
See application file for complete search history.

(56) References Cited

U.S. PATENT DOCUMENTS

2012/0025323 A1   2/2012  Teo et al.
2012/0292773 A1*  11/2012 Hosseini et al. ............. 257/761

FOREIGN PATENT DOCUMENTS

DE    102007043291 A1    4/2009
JP    2010-056179    * 11/2010    ............... H05K 3/06

OTHER PUBLICATIONS

Theophile, E., et al., "Industrielle Schichtabscheidung direkt aus dem kaltaktiven Plamastrahl," Sep. 29, 2009, pp. 1-12, Dresden.
"Copper Coating onto Silicon Semiconductor Wafers," reinhausen plasma, http://www.reinhausen-plasma.com/en/desktopdefault.aspx/tabid-1669/2230_read-5837/ downloaded Sep. 5, 2013, 1 page.

* cited by examiner

*Primary Examiner* — Lan Vinh
*Assistant Examiner* — Jiong-Ping Lu
(74) *Attorney, Agent, or Firm* — Slater & Matsil, L.L.P.

(57) ABSTRACT

Apparatuses and methods are provided where porous metal is deposited on a substrate, a mask is provided on the porous metal and then an etching is performed.

17 Claims, 4 Drawing Sheets

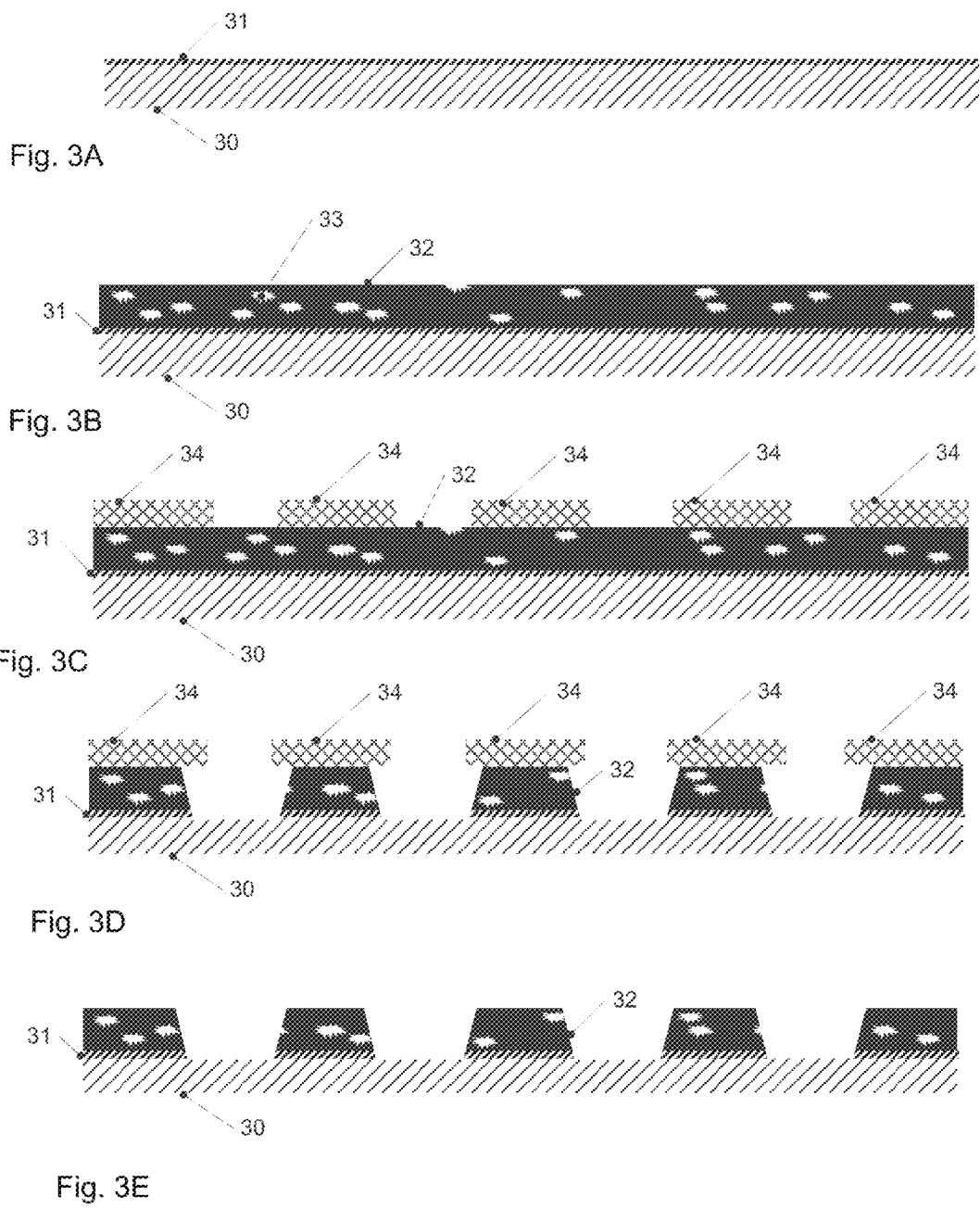

POROUS METAL ETCHING

TECHNICAL FIELD

The present application relates to structuring of porous metal layers by wet chemical etching.

BACKGROUND

In the manufacturing process of semiconductor devices, metal layers are deposited on substrates like semiconductor wafers. These metal layers are then structured to form for example interconnects, bonding pads, heat sinks or the like. Conventionally deposited metal layers, for example copper layers, may cause stress to a substrate, which may be undesirable in some circumstances. Similar problems may occur when depositing metal layers on other kind of substrates in other processes than semiconductor device manufacturing processes.

In recent years, the use of porous metal layers has been investigated. Porous metal layers may for example be deposited by plasma-based deposition methods or other methods and may exhibit varying porosity depending for example on the conditions during deposition of the metal layer. Porosity in this respect refers to the percentage of the metal layer being occupied by voids ("pores"), a high porosity layer having a higher percentage of its volume occupied by such voids than a layer with a lower porosity. Such porous metal layers may in some cases have favorable properties, for example in terms of stress induced. However, integration of such porous metal layers in manufacturing processes, e.g., of silicon-based devices constitutes an obstacle to be solved, in particular the structuring of such layers.

BRIEF DESCRIPTION OF THE DRAWINGS

FIGS. 3a to 3e show an example for various stages of processing according to an embodiment;

DETAILED DESCRIPTION OF ILLUSTRATIVE EMBODIMENTS

In the following, embodiments will be described in detail with reference to the attached drawings. It should be noted that these embodiments merely serve illustrative purposes and are not to be construed as limiting the scope of the present application in any way. For example, features from different embodiments may be combined with each other unless specifically note otherwise. Furthermore, while embodiments are described as comprising a plurality of features or elements, this should not be construed as indicating that all those features or elements are necessary for implementing the present invention. For example, other embodiments may comprise fewer features or elements, or features or elements of the described embodiments may be replaced with other features or other elements, for example other features or other elements which perform essentially the same function as the features or elements they replace.

Various embodiments relate to depositing a porous metal layer on a substrate, for example a semiconductor wafer, and subsequent structuring of the porous metal layer by wet chemical etching. For the structuring, a photosensitive film may be applied or deposited on a porous metal layer and structured via photolithography to form a mask, or a mask may be provided in a different manner. In some embodiments, a viscosity of the photosensitive film is chosen such that it essentially refrains from entering pores of the porous metal layer to facilitate a removal of the photoresist after the etching. "Essentially refrain from entering" in this respect is to be construed as indicating that the photoresist does not enter the pores to an extent which would make removal of the photoresist with standard processes, for example a bath in a solvent, impossible or difficult. In some embodiments, the photosensitive film may comprise a photoresist with high viscosity and/or may comprise a photosensitive sheet which, e.g., may be laminated onto the substrate.

Figure 1:
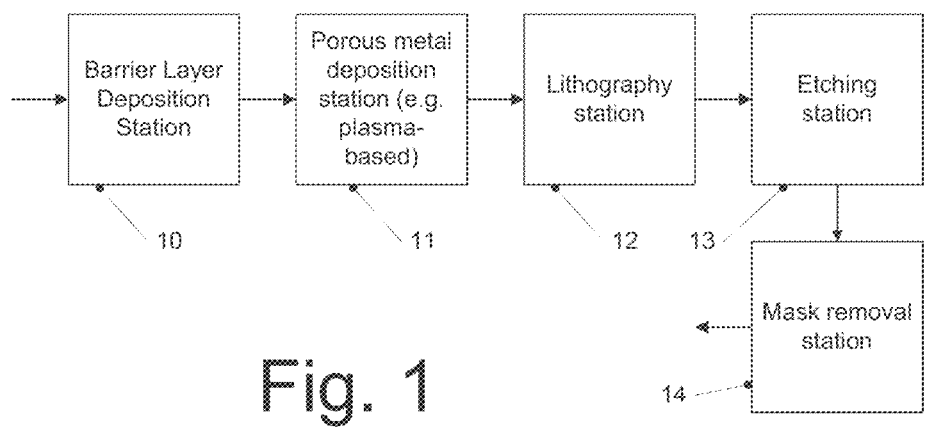
FIG. 1 schematically shows an apparatus according to an embodiment.

Turning now to the figures, FIG. 1 shows a processing apparatus according to an embodiment. The apparatus of FIG. 1 comprises a plurality of processing stations or devices in which substrates, for example semiconductor wafers, are successively processed. It should be noted that each station depicted may have several substations to perform several process steps consecutively within one of the stations. Moreover, it should be noted that the apparatus of FIG. 1 may be part of a larger processing apparatus, i.e., additional conventional stations may be present which process the substrate before entering the apparatus of FIG. 1 and/or which process the substrate after leaving the apparatus of FIG. 1. In particular, the apparatus of FIG. 1 may be used to process already structured semiconductor wafers, for example wafers where devices have been formed by steps like doping (for example, via ion implantation), growth of epitaxial layers, structuring of layers and the like. However, the apparatus of FIG. 1 may equally be used to process semiconductor wafers or other substrates which have not previously been processed, or processed substrates other than semiconductor wafers. Examples for another substrate type than semiconductor wafers include, for example, glass substrates and/or substrates for the manufacturing of solar devices. Also, the term "apparatus" as used herein is not to be construed as implying any specific spatial relationship between the components of the apparatus. For example, different stations shown in FIG. 1 may be located in different parts of a room or even in different rooms, with corresponding mechanisms to transfer substrates from one station to the next being provided. Likewise, different substations of a station need not be located proximate to each other.

First, in the embodiment of FIG. 1 the substrate is processing by a barrier layer deposition station 10. The barrier layer deposition station 10 deposits a barrier layer onto the substrate, for example a non-porous metal layer or a non-metal layer. The barrier layer may comprise an etch stop layer followed by a non-porous metal layer acting as seed layer for the subsequent deposition of a porous metal. The non-porous metal layer may be made of the same metal as a later deposited porous metal layer. For example, in some embodiments copper may be used. However, in other embodiments other kinds of metals may be used, for example aluminum or silver or an alloy. Also, in some embodiments the seed layer may be omitted. The etch stop layer may for example comprise titanium nitride, titanium-tungsten and/or tantalum. In other embodiments, the barrier layer deposition station 10 may be omitted.

After having been processed in barrier layer deposition station 10, the substrate with the barrier layer thereon is transferred to a porous metal deposition station 11, where a porous metal layer is deposited onto the barrier layer. The porous metal may for example be copper, but may also be another kind of metal, and may be deposited with a porosity between 5% and 90%, for example between 20% and 60% and a thickness between 10 µm and 1000 µm, e.g., between 50 µm and 600 µm. However, in general depending on the application any desired porosity and thickness may be selected by adjusting processing conditions accordingly.

Porous metal deposition station 11 may be a plasma-based porous metal deposition station. In such a method, a plasma deposition may be used in which a plasma jet and/or an activated carrier gas and/or a particle stream are generated, e.g., using a low temperature compared to processes like plasma/flame spraying and in which the speed of the activated particles is low compared to the processes like plasma spraying or cold gas spraying. The particles to be deposited, in particular metal particles like copper particles, may be supplied in powder form to the plasma jet using for example a carrier gas.

For generating the plasma jet, for example, a discharge between two electrodes may be used. To achieve this, for example, a voltage may be supplied to the electrodes, which are separated by a dielectric material. For example, the dielectric material may be an isolation pipe where one electrode is provided within the pipe and another electrode is provided outside the pipe.

In operation, in such an apparatus a glow discharge may result. By supplying a processing gas which streams through the device, which may be in form of a tube, a plasma jet is generated which may be mixed with the carrier gas. The carrier gas as mentioned above may include the particles used for coating a surface of a substrate, i.e., particles to be deposited on the surface, in this case metal particles. In various embodiments, the mixing may be carried out in a reaction zone outside of the part of the device generating the plasma jet. In the reaction zone, energy of the plasma may be transferred to the carrier gas and/or the particles included in the carrier gas. For example, the particles included in the carrier gas may be activated by the mixing of the carrier gas with the plasma jet in the reaction zone such that for example a stream or jet of activated particles may be generated. In some embodiments, a plurality of reaction zones may be provided.

As this is a conventional technique for deposition of porous metals, it will not be described in greater detail here. Other techniques for depositing porous metal layers may be used as well.

The thickness of the deposited metal layer may for example be between 10 µm and 1000 µm, for example, between 50 µm and 600 µm.

Such porous metal layers may have favorable properties regarding stress compared to metal layers deposited for example by physical vapor deposition (PVD) or electrochemical deposition (ECD).

After the porous metal has been deposited in porous metal deposition station 11, the substrate is transferred to a lithography station 12 which provides a mask on the porous metal for a subsequent etching in an etching station 13. Lithography station 12 may in some embodiments be a photolithography station where a photosensitive film is deposited on the porous metal and then structured by illuminating the photosensitive film for example through a mask and then developing the photosensitive film. During the developing, depending on whether the photosensitive film is a positive photosensitive film or a negative photosensitive film, either illuminated portions or non-illuminated portions of the photosensitive film are removed, thus forming a mask on the porous metal. The photosensitive film may have a high viscosity which is chosen such that the photosensitive film essentially refrains from entering pores of the porous metal layer. For example, a photosensitive sheet may be used.

The mask widths thus formed may for example have a width between 10 µm and 200 µm.

It should be noted that while lithography station 12 has been described as performing photolithography above, other kinds of lithography, for example, electron beam lithography, may also be used in other embodiments. In other embodiments, instead of lithography station 12 other kinds of mask providing stations may be used, in which, e.g., other kinds of masks may be applied to the porous metal, for example, based on adhesive sheets or other solid mask systems like plasma oxides or nitrides.

After lithography has been performed to form a mask on the porous metal layer in lithography station 12, the substrate is transferred to an etching station 13, where wet chemical etching is performed.

For etching, any typical metal etchant may be used. For example, a copper seed etchant comprising 2% $H_3PO_4$ and 0.8% $H_2O_2$ may be used. It has turned out and will be demonstrated later in greater detail that in this reproducible structure with a positive taper may be formed. In some embodiments, a saturation of the lateral etching rates has been observed which reduced the effect of variations of the etching time on the structures formed. Examples for this will also be described further below. The etchant used in some embodiments has a high etch rate for the porous layer to be etched and a high selectivity to the mask and an etch stop or barrier used.

After the etching, the substrate is transferred to a mask removal station, where the mask applied in photolithography station 12 is removed. For example, in case of a mask based on photosensitive film, a suitable solvent may be used for mask removal, or in case of a sheet photoresist the sheet may be peeled off. After the mask has been removed, the substrate may be subjected to further conventional processing as desired for a given manufacturing process.

Figure 2:
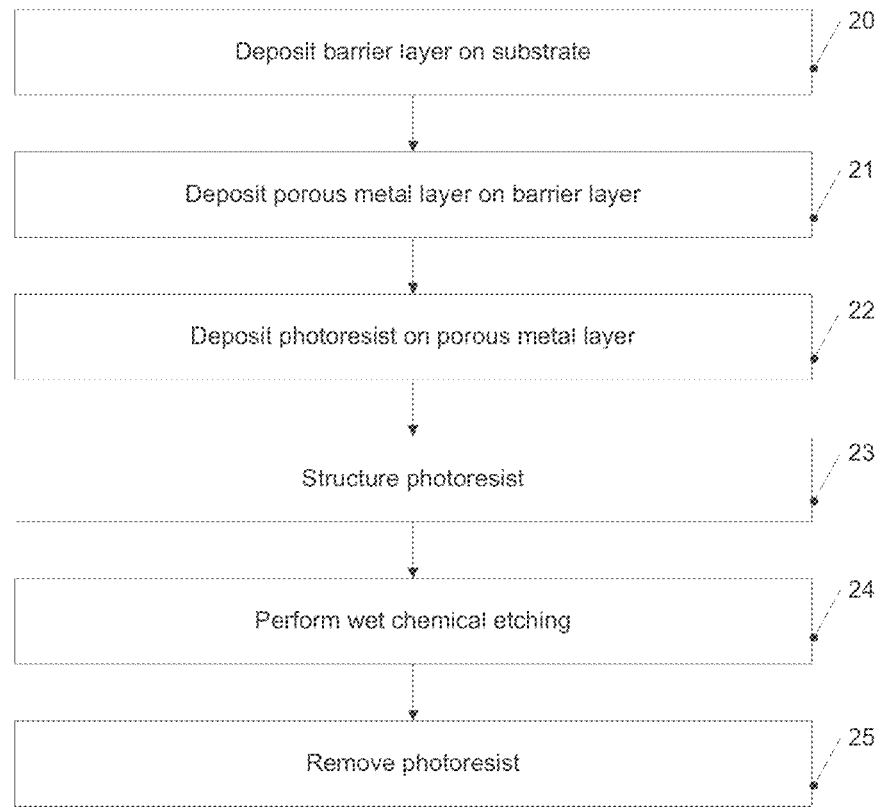
FIG. 2 shows a flowchart illustrating a method according to an embodiment.

In FIG. 2, a flowchart illustrating a method according to an embodiment is shown. While the method is presented as a series of acts or events, in other embodiments the order of the acts or events may be different unless specified otherwise, and/or acts or events may be omitted or replaced by other acts or events. The method of FIG. 2 may be implemented in the apparatus of FIG. 1, but may also be used independently therefrom.

At 20, a barrier layer is deposited on a substrate, for example barrier layer comprising an etch stop layer followed a metal layer like a copper layer, the latter acting as a seed layer. For example, physical vapor deposition or electrochemical deposition may be used to deposit the barrier layer. In some embodiments, the substrate may be a semiconductor wafer like a silicon wafer, for example a wafer which has already undergone some processing, for example, the formation of semiconductor devices on the wafer.

At 21, a porous metal layer is deposited on the barrier layer, for example using a plasma-based deposition method as described above with reference to FIG. 1.

Next, in the method of FIG. 2 a mask is formed or provided on the porous metal layer. In the embodiment specifically shown in FIG. 2, to form the mask at 22 a photosensitive film is deposited on the porous metal layer, and at 23 the photosensitive film is structured by illuminating and developing the photosensitive film. In other embodiments, other kinds of masks can be used, which may be structured using other methods, for example, plasma-based deposition of masks, for example oxide- or nitride-based solid masks.

At 24, a wet chemical etching is performed, for example using a conventional typical metal etchant. At 25, the remaining photosensitive film, i.e., the mask, is removed.

Metal layers structured in this manner may provide various advantages in some embodiments, for example low manufacturing costs reliability of the structuring, low process temperatures, for example, process temperatures below 400° C., or below 250° C. or below 200° C., reduction of wafer bending due to the reduced stress induced, good thermal conductivity and/or good electrical properties.

To further illustrate the apparatus of FIG. 1 and the method of FIG. 2, in FIG. 3 a substrate 30, for example a silicon wafer, is shown in various stages of processing. It should be noted that FIG. 3 serves only for illustration purposes and is not to be construed as limiting the scope of the present application in any way. In particular, the layers illustrated may have other dimensions, porosities, structures etc. than shown.

In FIG. 3a, a substrate 30 is shown with a barrier layer 31, for example an etch stop layer followed by a copper layer, deposited thereon. The barrier layer 31 may, for example, be deposited in barrier layer deposition station 10 of FIG. 1 or at 20 in FIG. 2.

In FIG. 3b, additionally a porous metal layer 32 is deposited on barrier layer 31, for example, in porous metal deposition station 11 of FIG. 1 or at 21 in FIG. 2 pores of porous metal layer 32 are symbolized by star-shaped voids 33. However, this shape is chosen only for illustration purposes.

In FIG. 3c, additionally a structured mask 34 is provided on porous metal layer 32. Mask 34 may for example be structured photosensitive film or any other mask, for example, provided by lithography station 12 or at 22 and 23 of FIG. 2.

In FIG. 3d, the substrate 30 is shown after a wet chemical etching has been performed on the substrate of FIG. 3c. As can be seen, at places where no mask 34 covered the porous metal layer 32, the porous metal layer 32 and the barrier layer 31 have been etched. To some extent, an underetching, i.e., an etching below mask 34, occurs. As will be explained further below, in some embodiments this underetching is self-limited, such that the underetching can be well controlled. The etching may, for example, be performed in etching station 13 of FIG. 1 or at 24 in FIG. 2.

In FIG. 3e, the mask 34 has been removed, for example, in mask removal station 14 of FIG. 1 or at 25 in FIG. 2. A substrate with a structured porous metal layer remains.

Figure 4A:
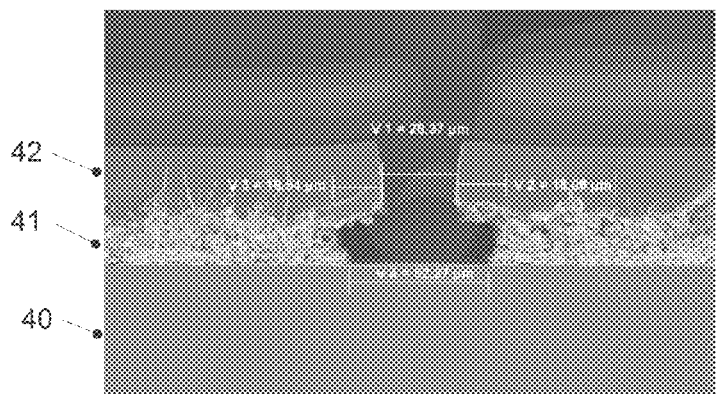
FIGS. 4a to 4c show electron microscopy images of structured metal layers according to an embodiment.
Figure 4B:
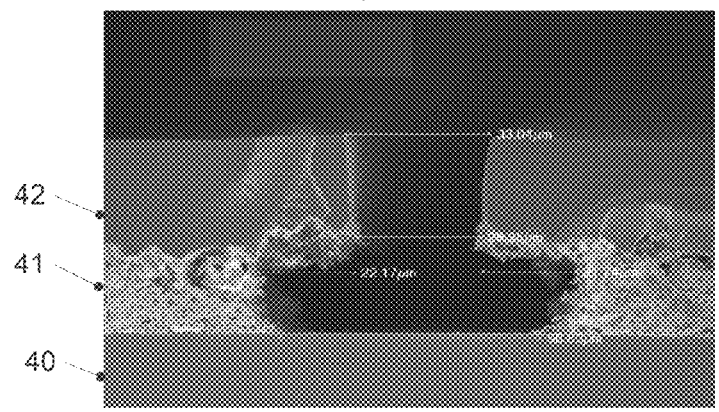
Figure 4C:
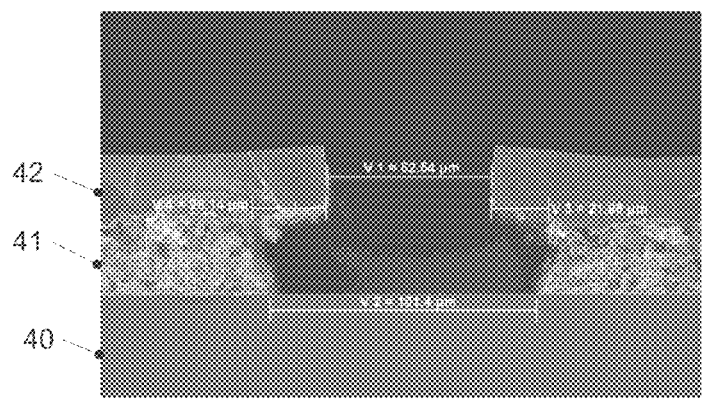

In FIGS. 4a to 4c, cross-sectional electron microscopy views of samples prepared in accordance with some embodiments are shown. In FIGS. 4a to 4c, 40 denotes a silicon substrate, 41 denotes a porous copper layer, and 42 denotes a mask. FIG. 4a has been taken after an etch time of 40 minutes, and FIG. 4b has been taken after an etch time of 140 minutes. As can be seen, the width of the structure only very slightly depends on the etching duration. Although the duration in FIG. 4b is more than three times the duration in FIG. 4a, the width of the etched structure in the porous metal layers has increased from 52.27 μm only to 58.83 μm, with an underetching in the order of 20 μm and a width of the opening in the mask of about 30 μm. Therefore, slight deviations in etching time are hardly critical, and even with slight variations a reproducible structuring can be obtained.

In FIG. 4c, an electron microscopy image of a further sample with a wider structure is shown. It should be remarked that the amount of underetching still is in the order of 20 μm. Therefore, in spite of the fact that the width of the structure has been doubled, the amount of underetching has not increased by the same amount, but remains between 20 and 30 μm.

In general, by keeping the structure width within a range between 10 μm and 200 μm, preferably between 20 μm and 100 μm, the time dependence of the underetching can be reduced in some embodiments.

The time dependence of the underetching has also been measured for other samples, and the results are summarized in the table below:

| Width of etch mask [μm] | Etch Width after 30 min Etch [μm] | Etch Width after 40 min Etch [μm] |
| --- | --- | --- |
| 28 | 41 | 53 |
| 46 | 78 | 84 |
| 60 | 100 | 100 |
| 80 | 125 | 125 |

As can be seen, the time dependence is small and becomes smaller for etch mask widths between 60 and 80 μm leading to structures between 100 and 125 μm width, respectively.

Figure 5:
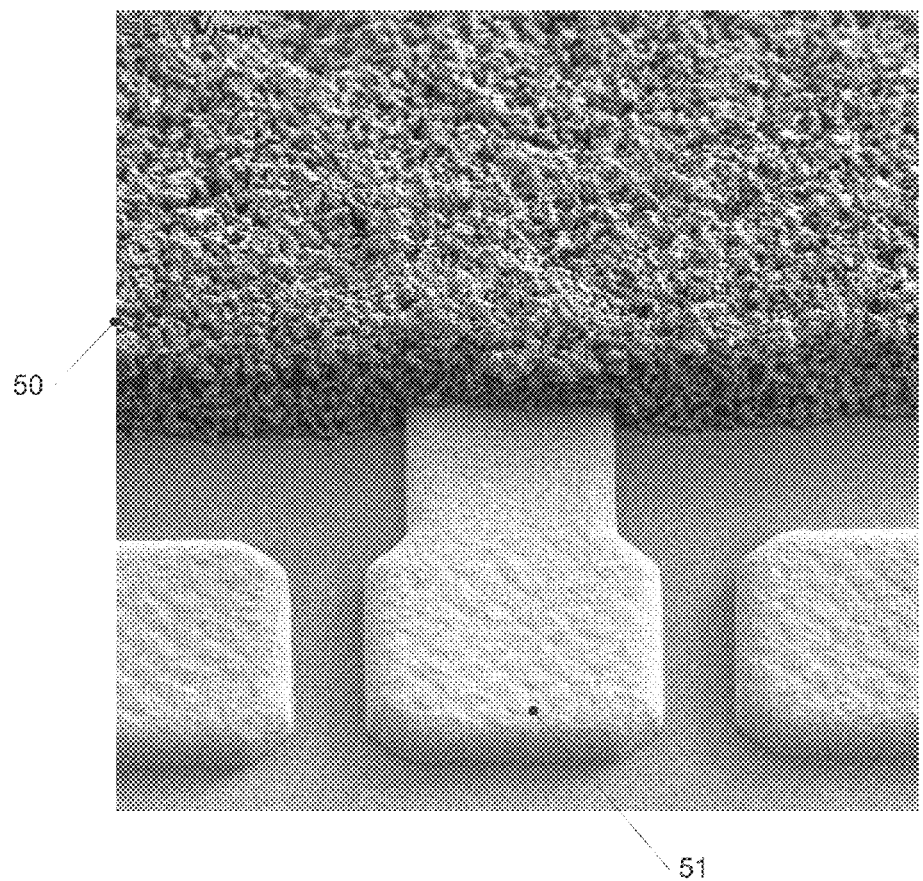
FIG. 5 shows a view of a structured device according to an embodiment.

In FIG. 5, a microscopic view of a device manufactured in accordance with embodiments is shown. In particular, the device of FIG. 5 comprises copper pads 51 deposited by electrochemical deposition and a porous copper layer 50 partially overlaying pads 51. Porous copper layer 50 has been structured by wet chemical etching to have precise dimensions.

Also the device of FIG. 5 merely serves illustration purposes, and porous metal structures manufactured in accordance with embodiments may be used for a plurality of applications, for example, as interconnects, bond pads or heat sinks.

Figure 6:
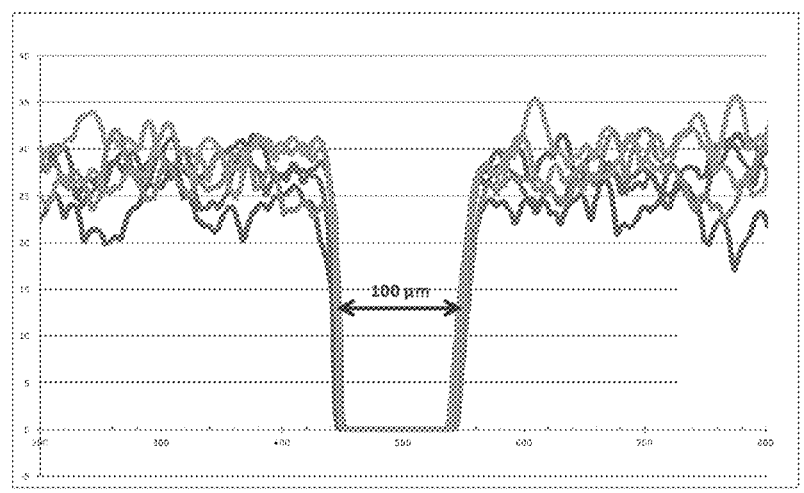
FIG. 6 illustrates reproducibility of structures in some embodiments.

As already mentioned, in some embodiments highly reproducible structures may be manufactured. For example, to illustrate this FIG. 6 shows measurement results for structures etched into a porous copper layer in accordance with embodiments, where structures were formed at a plurality of locations over the substrate having nominally the same dimensions. FIG. 6 shows measurement results for various ones of these structures over the substrate. As can be seen, in this example the width of the structure was 100 μm with high reproducibility over the substrate.

It should be noted that while copper has been used as an example for a porous metal layer in some of the embodiments above, other metals, for example silver, may also be used. Also alloys, for example alloys comprising at least 50% or at least 80% copper or other metals, for example metals with a comparatively low melting point, may be used.

Therefore, in accordance with some embodiments porous metal layers deposited on substrates, in particular on semiconductor substrates like silicon substrates, may be structured using wet chemical etching with a high amount of reproducibility.

What is claimed is:

1. A method, comprising:
   depositing a porous metal layer on a substrate;
   providing a mask on the porous metal layer, wherein providing the mask comprises:
   depositing a photosensitive film on the porous metal layer, wherein depositing the photosensitive film comprises providing the photosensitive film with a high viscosity such that the photosensitive film essentially refrains from entering pores of the porous metal layer; and
   structuring the photosensitive film; and wet chemical etching the porous metal layer provided with the mask.

2. The method of claim 1, wherein depositing the porous metal layer comprises depositing the porous metal layer using a plasma-based process.

3. The method of claim 1, wherein the wet chemical etching forms a porous metal structure with a width between 10 µm and 200 µm.

4. The method of claim 1, further comprising removing the mask after the etching.

5. The method of claim 1, further comprising depositing a barrier layer on the substrate prior to depositing the porous metal layer.

6. The method of claim 5, wherein the barrier layer serves as an etch stop for the etching.

7. The method of claim 1, wherein the metal comprises copper.

8. The method of claim 1, wherein wet chemical etching includes an etchant comprising $H_3PO_4$ and $H_2O_2$.

9. A method, comprising:
  depositing a porous metal layer on a substrate;
  providing a mask on the porous metal layer; and
  wet chemical etching the porous metal layer provided with the mask, wherein wet chemical etching includes an etchant comprising $H_3PO_4$ and $H_2O_2$.

10. The method of claim 9, wherein providing the mask comprises:
  depositing a photosensitive film on the porous metal layer; and
  structuring the photosensitive film.

11. The method of claim 10, wherein depositing the photosensitive film comprises providing the photosensitive film with a high viscosity such that the photosensitive film essentially refrains from entering pores of the porous metal layer.

12. The method of claim 9, wherein depositing the porous metal layer comprises depositing the porous metal layer using a plasma-based process.

13. The method of claim 9, wherein the wet chemical etching forms a porous metal structure with a width between 10 µm and 200 µm.

14. The method of claim 9, further comprising removing the mask after the etching.

15. The method of claim 9, further comprising depositing a barrier layer on the substrate prior to depositing the porous metal layer.

16. The method of claim 15, wherein the barrier layer serves as an etch stop for the etching.

17. The method of claim 9, wherein the metal comprises copper.

* * * * *